United States Patent [19]

Wu

[11] Patent Number: 5,995,363

[45] Date of Patent: Nov. 30, 1999

[54] STRUCTURE OF A CARRYING CASE FOR COMPUTER PERIPHERALS

[76] Inventor: Wen-Kao Wu, P.O. Box 86-144, Taipei, Taiwan

[21] Appl. No.: 09/035,156

[22] Filed: Mar. 5, 1998

[51] Int. Cl.[6] .................................................. H05K 5/00
[52] U.S. Cl. .......................... 361/679; 361/610; 361/685; 361/801; 312/223.1; 312/223.2
[58] Field of Search ..................................... 361/610, 679, 361/683, 685, 747, 755, 801; 312/223.1, 223.2

[56] References Cited

U.S. PATENT DOCUMENTS

| | | | |
|---|---|---|---|
| 5,526,226 | 6/1996 | Katoh et al. | 361/680 |
| 5,666,264 | 9/1997 | Chandler et al. | 361/683 |
| 5,743,606 | 4/1998 | Scholder | 312/223.2 |
| 5,777,848 | 7/1998 | McAnally et al. | 361/725 |
| 5,791,753 | 8/1998 | Paquin | 312/223.1 |
| 5,841,640 | 11/1998 | Shibata | 361/820 |

*Primary Examiner*—Leo P. Picard
*Assistant Examiner*—Boris L. Chervinsky
*Attorney, Agent, or Firm*—A & J

[57] ABSTRACT

A carrying case for computer peripherals includes an upper cover having two lower front ends and two lower rear ends, each of the lower front ends being provided with a button formed with a downwardly extending hook, a power supply fastened on inner side of the upper cover, a base having a bottom having two front corners each formed with a groove adapted to engage with the hook of the upper cover, a fixing plate mounted on an inner rear side of the base and provided with two brackets, and an axle extending through each of the lower rear ends of the upper cover and the brackets, whereby the upper cover is pivotally connected with the base and the power supply will be moved away from the base when the upper cover is turned open thus facilitating mounting of a computer peripheral inside the carrying case.

1 Claim, 4 Drawing Sheets

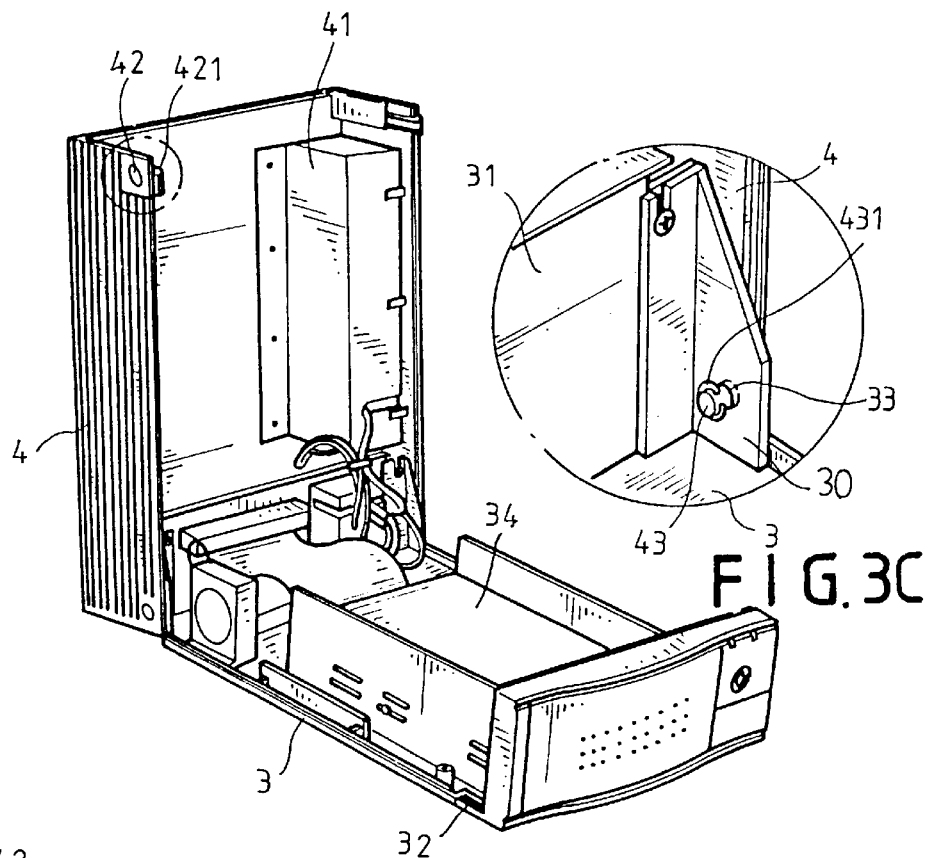
FIG. 3
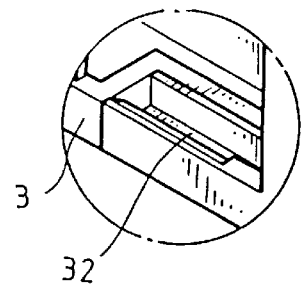
FIG. 3C
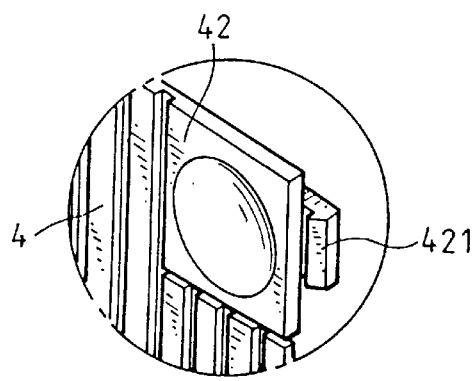
FIG. 3B
FIG. 3A

STRUCTURE OF A CARRYING CASE FOR COMPUTER PERIPHERALS

BACKGROUND OF THE INVENTION

1. Field of the Invention

This invention is related to an improvement in the structure of a carrying case for computer peripherals.

2. Description of the Prior Art

Referring to FIGS. 1, 1A and 1B, the conventional carrying case for computer peripherals generally includes a housing 1 and an upper cover 2 which is slidably engaged with the housing 1. A hard disk drive 22 is to be mounted within the upper cover 2. When desired to mount a hard disk drive 22 inside the upper cover 2, the upper cover 2 must be first pulled out of the housing 1 and then turned over to receive the hard disk drive 22. Thereafter, the hard disk drive 22 is secured to the upper cover 2 by extending screws 23 through the upper cover 2 into the threaded holes 221 of the hard disk drive 22. Then, the upper cover 2 together with the hard disk drive 22 must be turned over again in order to engage with the recess 11 of the housing 1 thereby casuing much inconvenience in assembly. Furthermore, a power supply 10 is fastened in the housing 1 thus decreasing the space for assembling operation. In addition, the electrical wires 13 are arranged close to the rear end of the housing 1 so that it is necessary to hold the upper cover 2 with one hand and connect the electrical wires 13 with the hard disk drive 22 with the other thereby causing much inconvenience in assembly. In addition, the rear side of the housing 1 has a hook 12 adapted for engaging with a hook 21 of the upper cover. However, it is very inconvenience to depress the hook 12 to release the upper cover 2 from the housing 1 and the hook 12 is easily damaged.

Therefore, it is an object of the present invention to provide an improvement in the structure of a carrying case for computer peripherals.

SUMMARY OF THE INVENTION

This invention is related to an improvement in the structure of a carrying case for computer peripherals.

It is the primary object of the present invention to provide a carrying case for computer peripherals of which the operation matches with ergonomics.

It is another object of the present invention to provide a carrying case for computer peripherals which can facilitate the mounting of a computer peripheral.

It is still another object of the present invention to provide a carrying case for computer peripherals which is low in cost.

It is still another object of the present invention to provide a carrying case for computer peripherals which is simple in construction.

It is a further object of the present invention to provide a carrying case for computer peripherals which is fit for practical use.

The foregoing objects and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

FIG. 1A is an enlarged fragmentary view of FIG. 1;

FIG. 1B is another enlarged fragmentary view of FIG. 2;

FIG. 3 illustrates the open condition of the carrying case for computer peripherals according to the present invention;

FIG. 3A is an enlarged fragmentary view of FIG. 3;

FIG. 3B is another enlarged fragmentary view of FIG. 3;

FIG. 3C is still another enlarged fragmentary view of FIG. 3;

DETAILED DESCRIPTION OF THE PREFERRED EMBODIMENT

Figure 1:
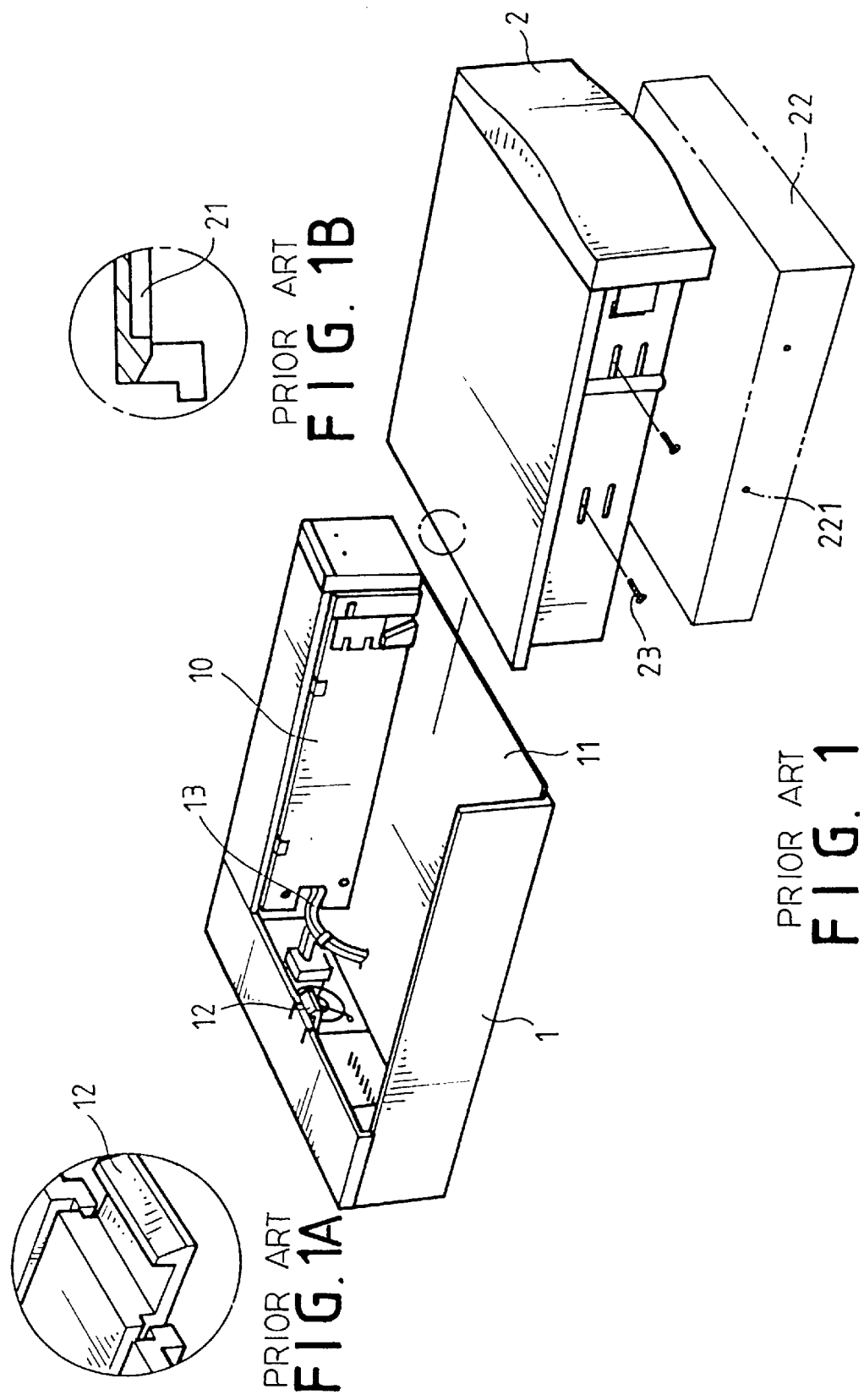
FIG. 1 is an exploded view of a prior art carrying case for computer peripherals.
Figure 2:
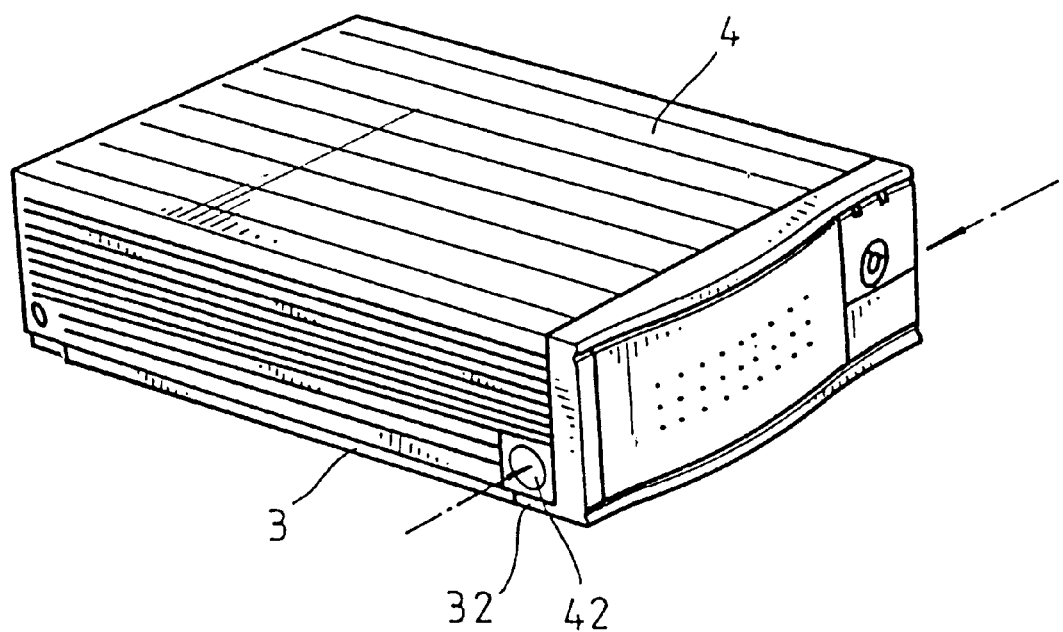
FIG. 2 is a perspective view of a carrying case for computer peripherals according to the present invention.

For the purpose of promoting an understanding of the principles of the invention, reference will now be made to the embodiment illustrated in the drawings. Specific language will be used to describe same. It will, nevertheless, be understood that no limitation of the scope of the invention is thereby intended, such alterations and further modifications in the illustrated device, and such further applications of the principles of the invention as illustrated herein being contemplated as would normally occur to one skilled in the art to which the invention relates.

With reference to the drawings and in particular to FIGS. 2, 3, 3A, 3B and 3C, the carrying case for computer peripherals according to the present invention generally comprises an upper cover 4 and a base 3 pivotally connected with the upper cover 4. The lower front ends of the upper cover 4 are each provided with a button 42 which is formed with a downwardly extending hook 421. A fixing plate 31 is mounted at the inner rear side of the base 3. Two brackets 30 each having a hole 33 are secured to two sides of the fixing plate 31. The lower rear ends of the upper cover 4 are each pivotally connected with one of the brackets 30 by an axle 43 which extends through the hole 33 of the bracket 30 and the lower rear end of the upper cover 4. A retainer ring 431 is engaged with the axle 43 for preventing the axle from detaching from the hole 33 of the bracket 30. The base 3 is formed with two grooves 32 at two front corners of the bottom adapted to engage with the hooks 421 of the buttons 42 of the upper cover 4. A hard (floppy) disk drive 34 (or a compact disk drive) may be directly mounted on the base 3 so that the power cords and the like can be easily connected to a computer. To open the upper cover 4, it is only necessary to depress the two buttons 42 and move the upper cover 4 upwards. A power supply 41 is fastened to the inner side of the upper cover 4 so that when the upper cover 4 is open, the power supply 41 will be away from the base 3 thereby increasing the space for mounting the hard (floppy) disk drive 34 (or a compact disk drive) on the base 3.

Figure 4:
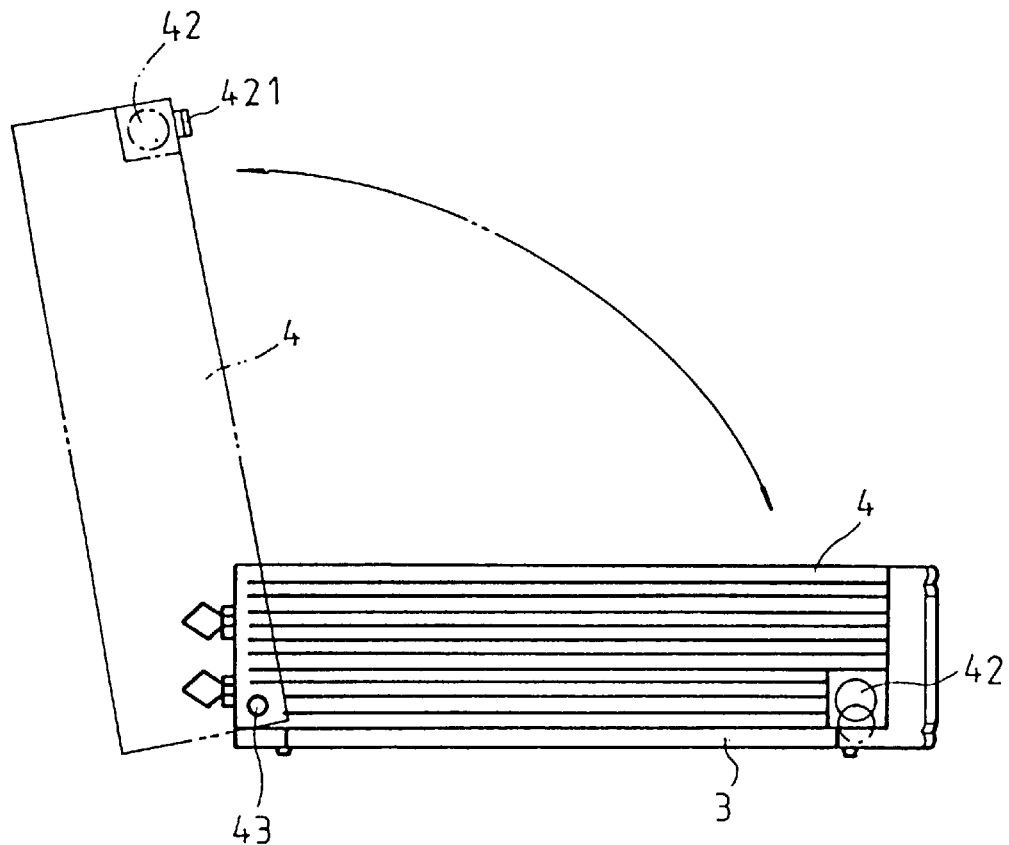
FIG. 4 illustrates how to open the carrying case for peripherals according to the present invention.
Figure 4A:
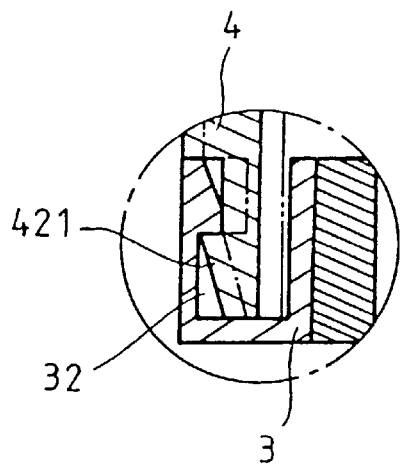
FIG. 4A is an enlarged fragmentary view of FIG. 4.

As the lower front ends of the upper cover 4 are each provided with a button 42 which is formed with a downwardly extending hook 421 (see FIG. 3B), the hook 421 will go inwardly when the button 42 is depressed and will go outwardly to engage with the groove 32 of the base 3 when the button is released (see FIGS. 3A and 4A). Hence, the carrying case according to the present invention can be easily open by depressing the buttons 42 and turning over the upper cover 4 with respect to the axles 43, as shown in FIG. 4. Furthermore, the upper cover 4 will be firmly engaged with the base 3 unless the buttons 42 are depressed.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

I claim:

1. A carrying case for computer peripherals comprising:

an upper cover having two lower front ends and two lower rear ends, each of said lower front ends being provided with a button formed with a downwardly extending hook;

a power supply fastened on inner side of said upper cover;

a base having a bottom having two front corners each formed with a groove adapted to engage with said hook of said upper cover;

a fixing plate mounted on an inner rear side of said base and provided with two brackets; and an axle extending through each of said lower rear ends of said upper cover and said brackets;

whereby said upper cover is pivotally connected with said base and said power supply will be moved away from said base when said upper cover is turned open thus facilitating mounting of a computer peripheral inside said carrying case.

\* \* \* \* \*